United States Patent
Lee et al.

(10) Patent No.: US 8,624,434 B2
(45) Date of Patent: Jan. 7, 2014

(54) PROTECTION CIRCUIT AND POWER SUPPLY SYSTEM FOR FLASH MEMORY

(75) Inventors: Meng-Shu Lee, Hsinchu Hsien (TW); Ching-Hsien Lee, Hsinchu Hsien (TW); Hao-Jung Li, Hsinchu Hsien (TW); Po-Chun Kuo, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 504 days.

(21) Appl. No.: 12/754,760

(22) Filed: Apr. 6, 2010

(65) Prior Publication Data

US 2010/0265785 A1  Oct. 21, 2010

Related U.S. Application Data

(60) Provisional application No. 61/170,116, filed on Apr. 17, 2009.

(51) Int. Cl.
*H02J 7/00* (2006.01)
*H02J 9/00* (2006.01)

(52) U.S. Cl.
USPC .......................................................... 307/66

(58) Field of Classification Search
USPC .......................................... 307/66, 91; 365/229
See application file for complete search history.

(56) References Cited

U.S. PATENT DOCUMENTS 4,399,524 A * 8/1983 Muguruma et al. ........... 365/229
2010/0080057 A1 * 4/2010 Reuter et al. .............. 365/185.04

\* cited by examiner

*Primary Examiner* — Carlos Amaya
(74) *Attorney, Agent, or Firm* — Edell, Shapiro & Finnan, LLC

(57) ABSTRACT

A protection circuit, applied to a flash memory including a power supply pin, includes a capacitor and a switch. A power supply provides a reference voltage. The capacitor is electrically connected to the power supply pin and a ground point. The switch is electrically connected between the power supply pin and the power supply. When the reference voltage is higher than a threshold voltage, the switch is turned on, such that the reference voltage is inputted into the power pin via the switch. When the reference voltage is lower than the threshold voltage, the switch is turned off.

18 Claims, 3 Drawing Sheets

PROTECTION CIRCUIT AND POWER SUPPLY SYSTEM FOR FLASH MEMORY

CROSS REFERENCE TO RELATED PATENT APPLICATION

This patent application claims the benefit of U.S. Provisional Application No. 61/170,116, filed Apr. 17, 2009, which is incorporated herein by reference in its entirety.

FIELD OF THE INVENTION

The present invention relates to a memory, and more particularly, to a protection circuit for flash memory.

BACKGROUND OF THE INVENTION

Flash memory is a non-volatile memory that is capable of retaining data stored therein even when not powered. Since flash memory has the advantages of having low volume, low power consumption, good shock resistance and fast writing speed, flash memory is widely applied to various types of electronic products such as memory cards, portable disks, digital cameras, portable electronic game consoles, minicomputers, and the like.

Flash memories apply floating-gate transistors for storing data, and are divided into two types—NOR flash and NAND flash according to an access mode of the flash memory; NOR flash memory is used for storing program code, and NAND flash memory is used for storing digital data. NAND flash memories are also divided into two structures according to the number of data stored in each of the transistors—a single-level cell (SLC) structure and a multi-level cell (MLC) structure.

NAND flash memory with the SLC structure has advantages of having a faster speed and lower power consumption, and each of the storage units in such NAND flash memory can store one information bit. Although a NAND flash memory with the MLC structure has a slower transmission speed and higher power consumption, each of the storage units in such NAND flash can store more than two information bits, thereby reducing production cost.

NOR flash memory comprises an address pin, a data pin and a control pin, which are independent from one another. In contrast, NAND flash memory transmits addresses, digital data and commands via a single input/output pin, and identifies types of current transmission information at the input/output pin via different control signals.

With respect to NAND flash memory, in a write procedure, an external control chip or a microprocessor transmits target addresses and digital data in sequence to the NAND flash memory via the input/output pin. The digital data is first temporarily stored in buffers in the NAND flash memory, and is then shifted from the buffers to storage units corresponding to the target addresses in a write period after the control chip or the microprocessor gives a write command.

When power supply of the NAND flash memory is interrupted before the write period ends, digital data being written into certain storage units may be destroyed. Since data being stored into the NAND flash memory may be program code currently being executed or calculated or other important data, when errors of the data occur, an electronic product containing the NAND flash memory may crash or incur critical errors.

In addition, many conventional flash memories comprise write protection pins. When a write protection pin of a conventional flash memory is programmed to a write protection status, the flash conventional memory rejects commands of writing data from any external systems. In theory, the conventional flash memory begins performing a write procedure only when the write protection pin is programmed to allow write operations.

However, in the foregoing write period, when a user or an external system accidentally switches the write protection pin of the conventional flash memory to enable write protection, the write procedure in process is interrupted. Accordingly, digital data currently being written into certain storage units may be destroyed and thereby detrimentally influence normal operations of an electronic product containing the conventional flash memory.

Compared to NAND flash memory with the SLC structure, when power supply is cut off or the write protection pin is changed during the write procedure, the consequences caused in the NAND flash memory with the MLC structure becomes more severe since not only is the digital data in the process of being written into the storage units destroyed, but other digital data originally stored in the same storage units may also be ruined.

Solutions for solving the foregoing problem of data destruction of a flash memory are not yet available in the prior art.

SUMMARY OF THE INVENTION

According to the present invention, a protection circuit and a power supply system applied to a flash memory are provided to avoid failure of a write procedure of the flash memory due to interruption of power supply.

According to an embodiment of the present invention, a protection circuit comprises a capacitor and a switch. The capacitor is electrically connected between a power supply pin of a flash memory and a ground point. The switch is electrically connected between the power supply pin and a power supply that provides a reference voltage to the power supply pin. When the reference voltage is higher than a threshold voltage, the switch is turned on to input the reference voltage to the power supply pin; when the reference voltage is lower than the threshold voltage, the switch is turned off.

In a situation that the switch is turned on, the power supply charges the capacitor of the protection circuit. Once the reference voltage provided by the power supply is interrupted, the switch is turned off. After the power supply is interrupted, the capacitor provides power to the power supply pin to ensure that the flash memory smoothly completes a write procedure.

According to another embodiment of the present invention, a power supply system, applied to a flash memory, comprises a power supply, a switch and a capacitor. The flash memory comprises a power supply pin, and the power supply is for providing a reference voltage. The switch is electrically connected between the power supply pin and the power supply. When the reference voltage is higher than a threshold voltage, the switch is turned on to input the reference voltage to the power supply pin via the switch; when the reference voltage is lower than the threshold voltage, the switch is turned off. The capacitor is connected between the power supply pin and a ground point.

The advantages and spirit related to the present invention can be further understood via the following detailed description and drawings.

DETAILED DESCRIPTION OF THE PREFERRED EMBODIMENT

Figure 1:
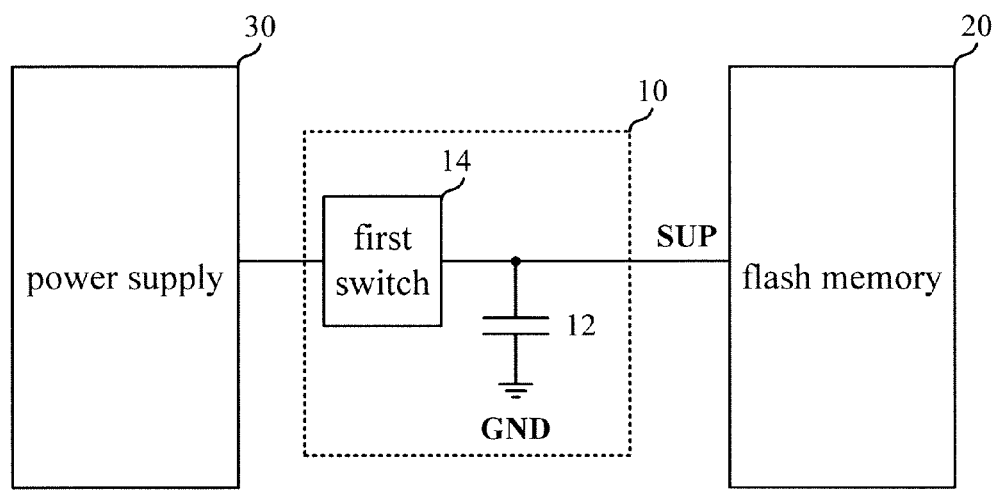
FIG. 1 is a schematic diagram of a protection circuit in accordance with a first embodiment of the present invention.

FIG. 1 shows a schematic diagram of a protection circuit applied to a flash memory in accordance with a first embodiment of the present invention. A protection circuit 10 comprises a first capacitor 12 and a first switch 14. A flash memory 20 comprises a power supply pin SUP. A power supply 30 provides a reference voltage $V_{DD}$ to the flash memory via the power supply pin SUP, and the reference voltage $V_{DD}$ serves as a power source for operating internal circuits of the flash memory 20. In practice, the flash memory 20 may be a NAND flash memory in an SLC or MLC structure.

The first capacitor 12 is electrically connected between the power supply pin SUP of the flash memory 20 and a ground point GND. The first switch 14 is electrically connected between the power supply pin SUP and the power supply 30. According to the present invention, a status of the first switch 14 is associated with a voltage value of the reference voltage $V_{DD}$. When the reference voltage $V_{DD}$ is higher than a predetermined threshold voltage $V_{TH}$, the first switch 14 is turned on; when the reference voltage $V_{DD}$ is lower than the predetermined threshold voltage $V_{TH}$, the first switch 14 is turned off.

In a practical application, switch 14 can be implemented with a diode, e.g., a Schottky diode, or other circuit components having the operating characteristics of the foregoing switch. In addition, the threshold voltage $V_{TH}$ can be defined as being approximately equal to or smaller than the reference voltage $V_{DD}$. Taking the reference voltage $V_{DD}$ equal to 3.3 V as an example, the threshold voltage $V_{TH}$ is relatively defined as 3.2 V or 3 V.

When the first switch 14 is turned on, in addition to providing the reference voltage $V_{DD}$ to the power supply pin SUP, the power supply 30 also charges the first capacitor 12 until a voltage at a connection point between the first capacitor 12 and the power supply pin SUP becomes equal to the reference voltage $V_{DD}$. Accordingly, when the power supply 30 provides a voltage under normal circumstances, the first capacitor 12 and the first switch 14 almost do not affect the flash memory 20.

Once the power supply provided by the power supply 30 becomes unstable or is suddenly interrupted, the voltage value of the reference voltage $V_{DD}$ is reduced to lower than the threshold voltage $V_{TH}$, and the first switch 14 is turned off, such that the voltage value of the power supply pin SUP is not dramatically reduced along with abrupt fluctuations of the reference voltage $V_{DD}$. At this point, the previously charged first capacitor 12 starts to provide power to the power supply pin SUP, so that the flash memory 20 can maintain a normal operation for a period, e.g., the flash memory 20 completes an on-going write procedure. Accordingly, the protection circuit 10 can avoid data destruction due to power instability or interruption during the write procedure of the flash memory.

According to the present invention, capacitance of the first capacitor 12 can be associated with an operation power consumption amount of the flash memory 20 in a write period. More specifically, the capacitance of the first capacitor 12 can be determined according to a power amount needed by the flash memory 20 for the write period, so that the power amount stored in the first capacitor 12 is enough to support operations of the flash memory 20 to complete the write period.

Figure 2:
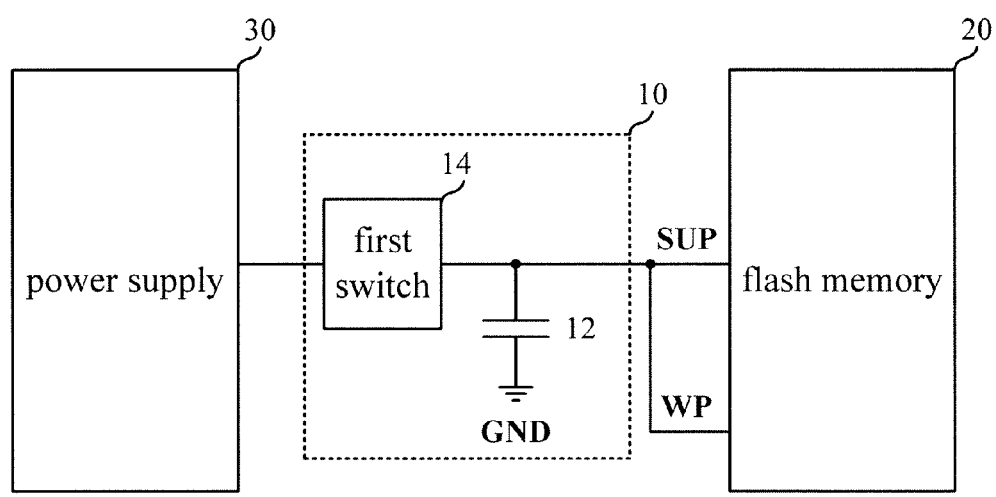
FIG. 2 is a schematic diagram of a protection circuit in accordance with a second embodiment of the present invention.

FIG. 2 shows a schematic diagram of a protection circuit in accordance with a second embodiment of the present invention. In this embodiment, a flash memory 20 comprises a write protection pin WP, and the flash memory 20 rejects a write procedure when an input voltage of the write protection pin WP is at a low level. The write protection pin WP is fixedly connected to the power supply pin SUP. Accordingly, in a process that the flash memory 20 performs a write procedure, a voltage value of the write protection pin WP remains at a high level due to the existence of the first capacitor.

The protection circuit in FIG. 2 may be controlled by software to enter or be released from a write protection status of the flash memory 20, so that the flash memory 20 is not completely incapable of write protection for the reason that the write protection pin WP is fixedly connected to a predetermined voltage. Thus, the protection circuit in FIG. 2 is capable of ensuring that data is not destroyed during the write procedure of the flash memory resulting from a status switch of the write protection pin.

Figure 3:
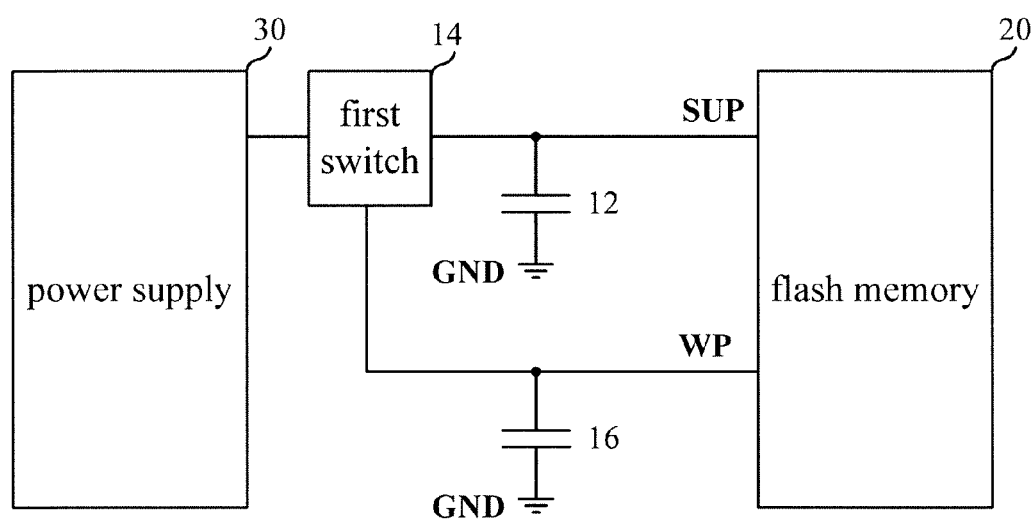
FIG. 3 is a schematic diagram of a protection circuit in accordance with a third embodiment of the present invention.

FIG. 3 shows a schematic diagram of a protection circuit in accordance with a third embodiment of the present invention. In this embodiment, the protection circuit further comprises a second capacitor 16 electrically connected between a write protection pin WP and a ground point, and the write protection pin WP is electrically connected to a power supply 30 via a first switch 14.

When the first switch 14 is turned on, in addition to charging the first capacitor 12, the power supply 30 also charges the second capacitor 16 until a voltage of a connection point between the second capacitor 16 and the write protection pin WP is equal to a reference voltage $V_{DD}$. When the reference voltage $V_{DD}$ is lower than a threshold voltage $V_{TH}$, the first switch 14 is turned off, and the connection between the write protection pin WP and the power supply 30 is cut off. At this point, the second capacitor 16 provides assistance to maintain a voltage of the write protection pin WP at approximately equal to $V_{DD}$ for a predetermined period.

A main difference between the third embodiment and the second embodiment is that, the second capacitor 16 is responsible for maintaining the voltage of the write protection pin WP in the third embodiment, instead of sharing the first capacitor 12 with the power supply pin SUP in the second embodiment. In a practical application, the capacitance of the second capacitor 16 can be determined according to a length of a write period of the flash memory 20, so that the amount of power stored in the second capacitor 16 is enough to maintain the write protection pin WP at a high-level voltage during the write period of the flash memory 20. Accordingly, it is also ensured that the flash memory 20 is prevented from data destruction in the write procedure due to a status switch of the write protection pin WP.

Figure 4:
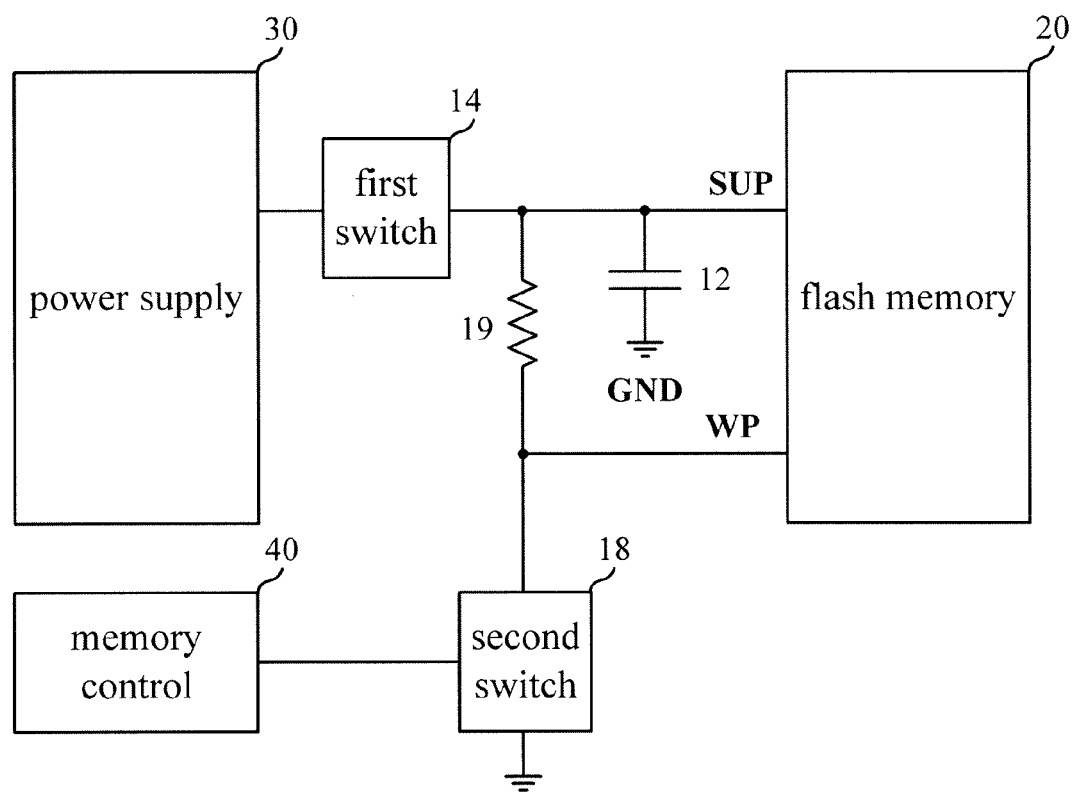
FIG. 4 is a schematic diagram of a protection circuit in accordance with a fourth embodiment of the present invention.

FIG. 4 shows a schematic diagram of a protection circuit in accordance with a fourth embodiment of the present invention. In this embodiment, supposing that an input voltage of a write protection pin WP is at a low level, the flash memory 20 rejects a write procedure. In this embodiment, the protection circuit provided by the present invention further comprises a second switch 18 and a resistor 19.

The resistor 19 is electrically connected between the write protection pin WP and a power supply pin SUP. The second switch 18 is electrically connected between the write protection pin WP and a ground point GND. When the second switch 18 is turned on, the write protection pin WP is electrically connected to the ground point GND. In practice, the second switch 18 is realized by one or multiple metal-oxide semiconductor components.

Referring to FIG. 4, the second switch 18 is controlled by a memory control 40. Under normal circumstances, the memory control 40 turns off the second switch 18 to connect the write protection pin WP to the power supply pin SUP via the resistor 19 without being influenced by the second switch 18 and the connected ground point GND. Since input resistance of the write protection pin WP is rather large, voltages of the write protection pin WP and the power pin SUP are almost the same. Therefore, the protection circuit according to this embodiment of the present invention also can provide a protection effect of the write protection pin WP as that of the second embodiment.

When a user wishes that the flash memory 20 enters a write protection status, the memory control 40 turns on the second switch 18, and thus the write protection pin WP is electrically connected to a ground point GND to achieve an effect that the flash memory 20 enters the write protection status. Provided that the resistance of the resistor 19 is large enough, a voltage of the power supply pin SUP is not dramatically affected. In an embodiment, the second switch 18 is integrated inside the memory control 40.

A power supply system, comprising the protection circuit 10 and the power supply 30 shown in FIG. 1, is provided in accordance with a fifth embodiment of the present invention. An operation approach and a conception of the fifth embodiment are similar to those of the first embodiment, and detailed description thereof shall not be described for brevity. It is to be noted that the power supply system further comprises wires and components to maintain the write protection pin WP in a higher-level status as shown in FIGS. 2, 3 and 4.

In conclusion, a protection circuit and a power supply system, provided by the present invention, are capable of providing voltages of a power supply pin and a write protection pin to a flash memory, so as to avoid failures of a write procedure of the flash memory due to interruption of power supply and thereby ensuring normal operations of an electronic product containing the flash memory. The protection circuit and the power supply system provided by the present invention can be applied to various types of electronic apparatuses containing flash memories as storage units to render enhanced protection effects.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A protection circuit, applied to a flash memory which comprises a power supply pin for receiving a reference voltage provided by a power supply, the protection circuit comprising:
   a first capacitor, coupled between the power supply pin and a ground point; and
   a first switch, coupled between the power supply pin and the power supply, the first switch configured to be turned on to pass the reference voltage to the power supply pin when the reference voltage is higher than a threshold voltage, and to be turned off when the reference voltage is lower than the threshold voltage,
   wherein the first capacitor provides first capacitance, a value of which is determined according to a power consumption amount of the flash memory for a write period.

2. The protection circuit as claimed in claim 1, wherein the first switch is a diode.

3. The protection circuit as claimed in claim 1, wherein the power supply charges the first capacitor when the first switch is turned on, and the first capacitor provides power to the power supply pin when the first switch is turned off.

4. The protection circuit as claimed in claim 1, wherein the flash memory is a NAND flash memory.

5. The protection circuit as claimed in claim 4, wherein the NAND flash memory is a multi-level cell NAND flash memory.

6. The protection circuit as claimed in claim 1, wherein the flash memory further comprises a write protection pin, which is coupled to the power supply pin.

7. The protection circuit as claimed in claim 1, the flash memory further comprising a write protection pin, the protection circuit further comprising:
   a resistor, coupled between the write protection pin and the power supply pin; and
   a second switch, coupled between the write protection pin and the ground point, the write protection pin being electrically connected to the ground point when the second switch is turned on.

8. The protection circuit as claimed in claim 1, the flash memory further comprising a write protection pin, and the protection circuit further comprising:
   a second capacitor, coupled between the write protection pin and the ground point, the write protection pin being coupled to the power supply via the first switch.

9. The protection circuit as claimed in claim 8, wherein the second capacitor comprises second capacitance, which is associated with a write period of the flash memory.

10. A power supply system, applied to a flash memory comprising a power supply pin, the power supply system comprising:
    a power supply, for providing a reference voltage;
    a first switch, coupled between the power supply pin and the power supply, the first switch configured to be turned on to pass the reference voltage to the power supply pin when the reference voltage is higher than a threshold voltage, and to be turned off when the reference voltage is lower than the threshold voltage; and
    a first capacitor, coupled between the power supply pin and a ground point, wherein the first capacitor provides first capacitance, a value of which is determined according to a power consumption amount of the flash memory for a write period.

11. The power supply system as claimed in claim 10, wherein the first switch is a diode.

12. The power supply system as claimed in claim 10, wherein the power supply charges the first capacitor when the first switch is turned on, and the first capacitor provides power to the power supply pin when the first switch is turned off.

13. The power supply system as claimed in claim 10, wherein the flash memory is a NAND flash memory.

14. The power supply system as claimed in claim 13, wherein the NAND flash memory is a multi-level cell NAND flash memory.

15. The power supply system as claimed in claim 10, wherein the flash memory comprises a write protection pin, which is coupled to the power supply pin.

16. The power supply system as claimed in claim 10, the flash memory comprising a write protection pin, and the power supply system further comprising:

a resistor, coupled between the write protection pin and the power supply pin; and a second switch, coupled between the write protection pin and the ground point, the write protection pin being electrically connected to the ground point when the second switch is turned on.

17. The power supply system as claimed in claim 10, the flash memory comprising a write protection pin, the power supply system further comprising:

a second capacitor, coupled between the write protection pin and the ground point, the write protection pin being coupled to the power supply via the first switch.

18. The power supply system as claimed in claim 17, wherein the second capacitor comprises second capacitance, which is associated with a write period of the flash memory.

* * * * *